United States Patent [19]

Seitz et al.

[11] 4,299,131

[45] Nov. 10, 1981

[54] METHOD AND APPARATUS FOR TESTING THE CLAMP OF A SOLDERLESS ELECTRIC CONNECTION

[75] Inventors: Max Seitz; Hans P. Thümm; Günther Hagen; Gerald Grad, all of Munich, Fed. Rep. of Germany

[73] Assignee: Siemens Aktiengesellschaft, Berlin & Munich, Fed. Rep. of Germany

[21] Appl. No.: 110,546

[22] Filed: Jan. 8, 1980

[30] Foreign Application Priority Data

Jan. 24, 1979 [DE]  Fed. Rep. of Germany ....... 2902696

[51] Int. Cl.³ .............................................. G01N 3/20
[52] U.S. Cl. ....................................... 73/789; 73/856; 73/852
[58] Field of Search ................. 73/788, 789, 795, 805, 73/806, 817, 849, 852, 856, 161, 133 R

[56] References Cited

U.S. PATENT DOCUMENTS 2,702,473  2/1955  Dames et al. .......................... 73/805
4,167,112  9/1979  Ressler ................................... 73/161

OTHER PUBLICATIONS

Brochure Entitled "Clamp Connection Termi Point Wiring Technique", Siemens (SFR F12–F145), Nov. 1976.

Primary Examiner—Charles A. Ruehl
Attorney, Agent, or Firm—Hill, Van Santen, Steadman, Chiara & Simpson

[57] ABSTRACT

An apparatus and method for testing the mechanical strength of a solderless electrical connection having a clamp deformable to retain a bundle of wires against a pin has a double-T-shaped cross piece over which a clamp to be tested is slided. The cross piece has a vertical bore therein for receiving a pressure-applying die for subjecting the clamp to a test pressure. The die is actuated by a motor-driven spindle and a transducer transforms the applied pressure to a voltage for display. Pressure is applied following a pre-determined curve corresponding to worst cast configurations of a wire bundle which may result in failure of the clamp to securely retain the bundle.

11 Claims, 8 Drawing Figures

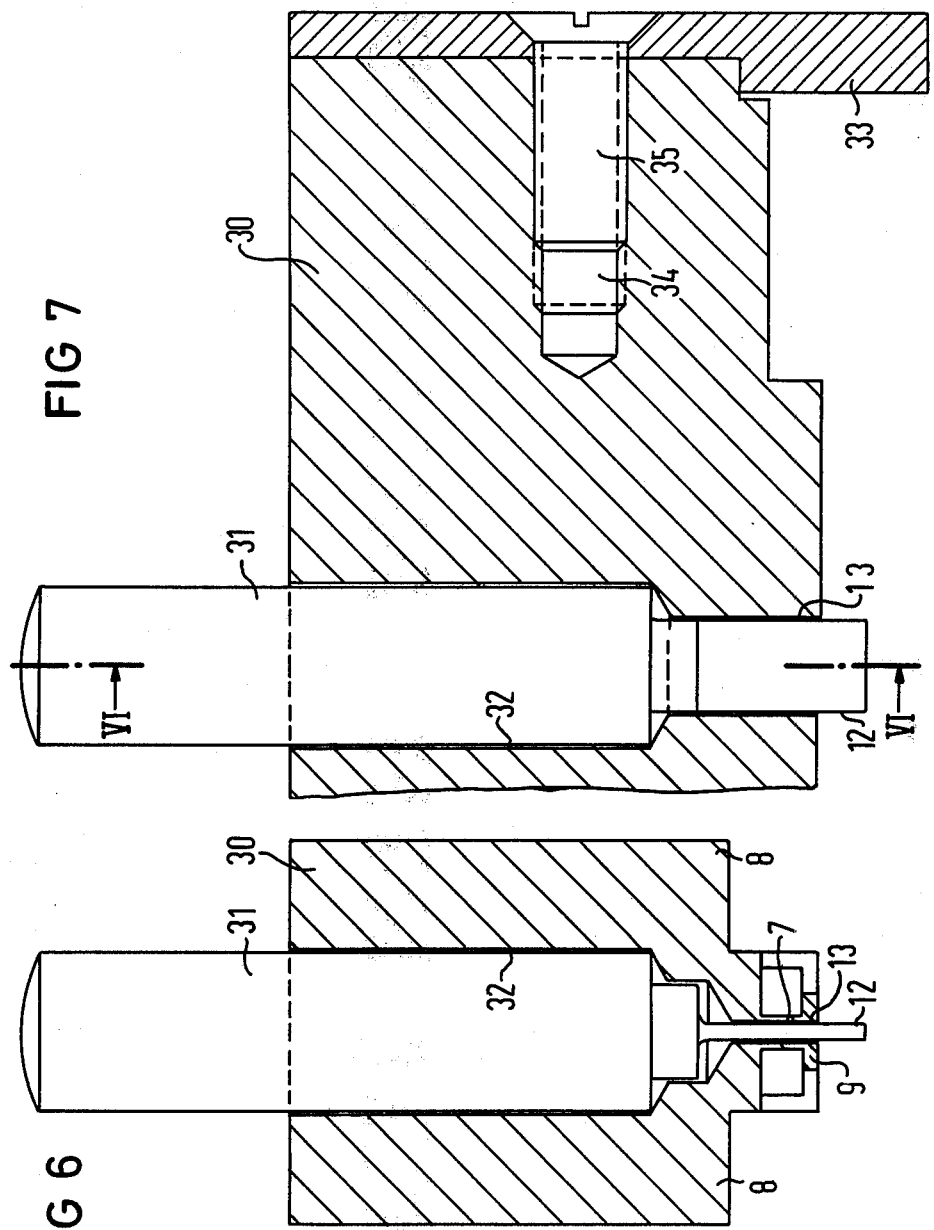

METHOD AND APPARATUS FOR TESTING THE CLAMP OF A SOLDERLESS ELECTRIC CONNECTION

BACKGROUND OF THE INVENTION

1. Field of the Invention

The present invention relates to a method and apparatus for testing the clamp strength of an electrical connection, and in particular to a method and apparatus for achieving such testing which simulates worst case configurations for a wire bundle.

2. Description of the Prior Art

Solderless electric clamp connections of the type described in Siemens brochure SFR F12-F1545 November, 1976, "Clamp Connection" are known in the art. Such connectors have a deformable metallic clamp comprised of opposed legs which are initially spaced apart to receive a bundle of wires and are subsequently forced together to retain the wires against a pin. As described in the above brochure, assembly of such a clamp is generally undertaken by the use of a pistol which is "loaded" with a clamp and an insulated wire end is inserted into the clamp and pressed therein by actuating the trigger of the pistol. The tip of the pistol containing the clamp and wire assembly is positioned over a pin to which the clamp is to be attached and pressure applied to force the legs of the clamp around the pin fixing the clamp assembly thereto. A high strength electrical connection is thus achieved without the use of solder.

According to prescribed testing procedures, the strength of such a connection is measured by testing the gripping strength of the clamp to the pin, with little or no attention given to the mechanical strength of the wire-clamp attachment. Such testing generally proceeds by applying a so called removal tester to the pin which has an element which is pushed against the clamp on the pin and the applied force is measured by a calibrated spring contained in the grip of the removal force tester. In order to pass the test, the clamp cannot be displaced when forces less than a specified maximum are applied.

Such a testing procedure is insufficient because it does not test the clamping strength of the clamp surrounding the bundle of wires. Even though such an attachment may be tight and exhibit sufficient strength when first assembled, a loosening of this attachment can occur when the wires within the insulation move relative to the clamp pin. In the processing of multiple wire conductors, the individual wires may during assembly initially arrange themselves in bundles which due to later movement of the conductor can shift. For example, a bundle of wires may initially be arranged generally in circular cross section but may subsequently re-align themselves in a flattened pattern or straight line consisting of adjacent wires. When this occurs, even though the clamp may have initially been applied to the bundle of wires with sufficient clamping strength, the movement of the wires beneath the closed clamp may result in a loosening of the wire because the individual clamp legs do not have sufficient spring tension to automatically compensate for a change in wire bundle cross section.

It is thus a problem in the art to provide a method and apparatus for testing the mechanical strength of a solderless electrical connection of the type described above which can account for the extreme cases wherein the wires are initially arranged in a circular pattern and later re-distribute themselves into an essentially straight configuration.

SUMMARY OF THE INVENTION

It is an object of the present invention to provide a method and apparatus for testing the mechanical strength of a clamp electrical connection with which the specific properties of the clamp with regard to a changing wire bundle cross section can be examined and checked.

Such a method consists of applying a force to a clamp to be tested which simulates spreading of the portion of the clamp which is to receive the pin and then backing off from this pressure while continuously monitoring the clamping pressure of the legs of the clamp. The test pressure is applied and removed in accordance with a pre-determined curve corresponding to minimum pressures necessary in order to retain the bundle of wires not only in a circular configuration but also in a generally flat configuration.

An apparatus for achieving this method consists of a double-T-crosspiece having a lower crossbar which is receivable in the clamp and having a vertical bore therein for receiving a pressure actuator movable by a motor driven spindle. The motor is a step motor which is digitally controlled to apply and remove pressure in accordance with a pre-calculated curve simulating the above-described wire configuration pressures.

DESCRIPTION OF THE DRAWINGS

FIG. 6 is a sectional view taken along line VI—VI of FIG. 7.

FIG. 7 is a sectional view taken along line VII—VII of FIG. 5.

DESCRIPTION OF THE PREFERRED EMBODIMENTS

Figure 1:
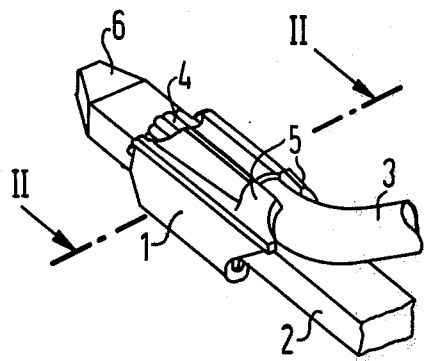
FIG. 1 is a perspective view of a solderless electric clamp connection.
Figure 2:
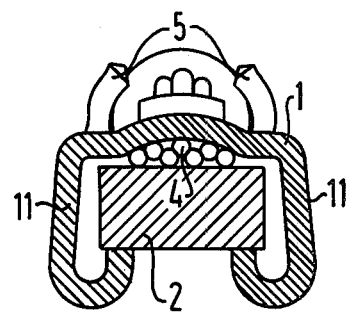
FIG. 2 is a sectional view taken along line II—II of FIG. 1.

A solderless clamp electrical connector is shown in FIGS. 1 and 2 which comprises a clamp 1 having downwardly extending legs 11 which form a receptacle for receiving a pin 2. The clamp 1 has upwardly extending opposed flanges 5 for receiving an insulated conductor 3 having multiple wires 4. The pin 2 has a beveled end 6.

As clearly shown in FIG. 2, the exposed multiple wires 4 are held between the clamp 1 and the pin 2 by pressure exerted by the legs 11. The wires 4, clamp 1 and pin 2 are assembled in electrically connecting relation by a pistol device, as described above. As shown in cross section in FIG. 2, the multiple wires 4 may arrange themselves generally in a single layer, however, the wires may also be arranged in a circular twisted pattern as would commonly be seen if the conductor 3 were viewed in cross section without deformation.

Figure 3:
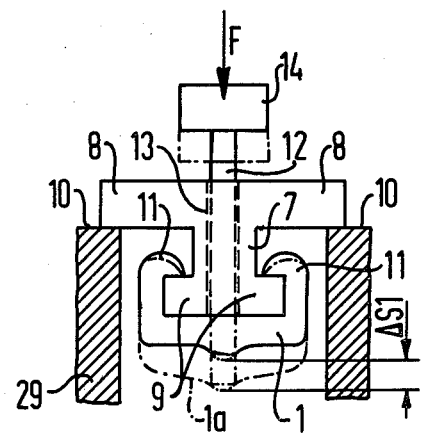
FIG. 3 is a schematic illustration of the principle of an apparatus for testing the clamping strength of the clamp of FIG. 1.

The principle utilized in the present invention for testing the pressure exerted by the clamp 1 to retain the wires 4 against the pin 2 is illustrated in FIG. 3. The apparatus shown in FIG. 3 simulates wire-retaining pressures which would result if a pin 2 were inserted in the clamp 1.

Referring to FIG. 3, the apparatus consists of a double-T-crosspiece having a pair of parallel crossbars 8 and 9. The crossbar 8 is longer than the crossbar 9 and is supported on a test holder block 29 having bearing surfaces 10. The cross-bars 8 and 9 are joined by a vertical member 7 through which a longitudinal bore 13 extends. A pressure actuator 12 having a force receiver 14 is slidably retained in the bore 13. In operation, a clamp 1 to be tested is slipped over the shorter cross-bar 9 and a force F applied in the direction of the arrow. This deforms the clamp 1 to the position shown in the dashed line designated at 1a. This deformation is a result of moving the pressure actuator 12 a distance $\Delta S1$.

Figure 4:
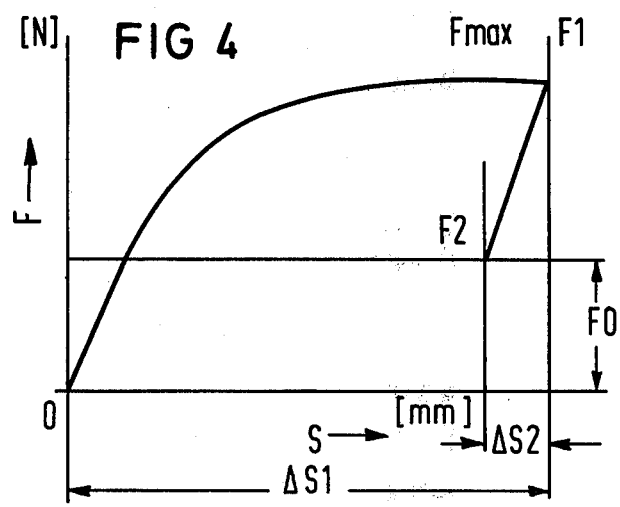
FIG. 4 is a representative pressure curve for applying and removing pressure to test the clamping strength of the clamp of FIG. 1.

The distance $\Delta S1$ is determined with reference to a curve as represented in FIG. 4. The curve of FIG. 4 shows the relation between a force F measured in newtons associated with a movement of a distance S of the clamp 1 measured in millimeters. When pressure is applied following the curve as shown in FIG. 4, the pressure actuator 12 acts virtually in the same manner as if the individual wires 4 prior to slipping the clamp 1 over the clamp pin 2, were arranged essentially in a circular pattern. The curve of FIG. 4 also allows movement of the pressure actuator 12 in a manner corresponding to a redistribution of the individual wires 4 to the essentially flat configuration shown in FIG. 2. The requisite expansion or spreading force F for the clamp 1 initially rises linearly as shown in FIG. 4. Upon reaching a yield point, the characteristic curve increases to a maximum $F_{max}$ and finally collapses. If the force applied by the pressure actuator 12 is applied over the distance $\Delta S1$ then the expansion force F rises to the maximum $F_{max}$ and then again drops off slightly to F1. If the pressure actuator 12 is now taken back by the path distance $\Delta S2$, the pressure which corresponds to the expansion force drops to the value F2. The path $\Delta S2$ corresponds to the collapse of the wires 4 into the configuration shown in FIG. 2. This value can be obtained by mathematical computation of the difference of the diameter of the conductor wire bunch and the diameter of an individual wire 4. Thus, the two extreme cases are represented in FIG. 4 whereby the individual wires 4 in one case form a circular bundle and in the other extreme case the individual conductors lie virtually in a single layer between the clamp 1 and the clamp pin 2.

As long as the expansion force F2 does not fall below a minimum force F0, it can be assumed that the quality of the clamp connection is adequate. The value $\Delta S1$ can be determined by computation as well as emperically by using as a basis the characteristic curve of the clamp according to FIG. 4. This characteristic curve can be plotted with a test apparatus as illustrated in FIG. 5.

Figure 5:
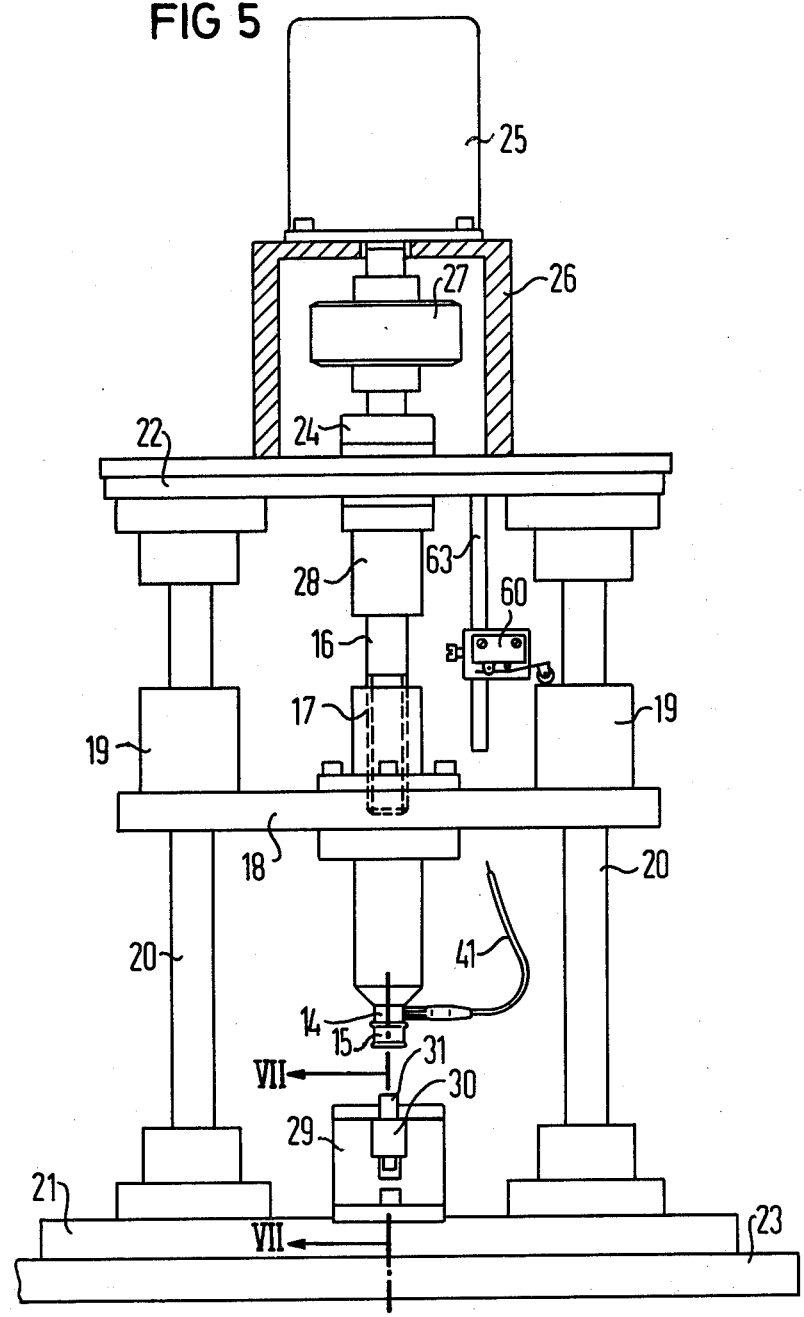
FIG. 5 is a full side view of an apparatus for testing the clamping strength of the clamp of FIG. 1.

FIG. 5 illustrates the basic construction of an apparatus for carrying out the method according to the principle embodied in FIG. 3. Parts which are equal in terms of function in FIGS. 3 and 5 are provided with the same reference numerals.

As shown in FIG. 5, a force receiver 14, preferably a piezoelectric quartz crystal, is mounted with a thrust washer 15 at one end of a nut 17 which is capable of movement by a spindle or shaft 16 in a vertical direction. The nut 17 is mounted on a cross arm 18 which is longitudinally displaceable with the aid of bushings 19 and guide columns 20 arranged on both sides of the cross arm 18. The guide columns 20 are supported on a base 21 and are attached at upper ends thereof to a motor cross arm 22. The base 21 is further supported by a base plate 23.

The motor cross arm 22 has mounted thereon an axial bearing 24 is driving connection to a shaft 28 which, as an extension of the spindle 16, transmits the measuring pressure. The shaft 28 is connected through a compensating coupling 27 to establish a closed linkage with a motor 25. The motor 25 is supported by a mounting 26 on the motor cross arm 22.

The base 21 supports a test holder supporting frame 29 for a test holder 30 which retains a clamp to be tested. The holder 30 is illustrated in greater detail in FIGS. 6 and 7. The test spindle 12 cannot be seen in FIG. 5, however an enlarged upper end 31 thereof is shown extending from the test holder 30.

The motor 25 is a step motor and is connected to a source of step pulses so that the spindle 16 is advanced in step-by-step fashion through the coupling 27 and the shaft 28, so that the thrust piece 15 with the force absorber 14 are moved in the direction of the upper shaft end 31 of the pressure actuator 12. By utilizing corresponding advance and reverse pulse specifications to control the motor 25, the defined path distances $\Delta S1$ or $\Delta S2$ can be specified for movement of the spindle 16.

FIGS. 6 and 7 illustrate the test holder 30 on an enlarged scale. The double-T-shaped crosspiece 7 appearing in FIG. 3 is shown in FIG. 7 as integrally formed as part of the test holder 30.

A clamp to be tested is slipped over the shorter crossbar 9 of the crosspiece 7 until it comes to lie over the bore 13 through which the pressure actuator 12 extends. Because the clamp to be tested is relatively small, the pressure actuator 12 must be correspondingly dimensioned. The pressure actuator 12 therefore has a thicker guide shaft 31 which is guided in a correspondingly constructed bore 32 in the test holder 30.

As shown in FIG. 7, an angle piece 33 is mounted on the holder 30 by the use of a threaded screw 35 and bore 34 to provide a suitable handle for the holder 30. The test holder 30 is capable of insertion into a corresponding recess in the support 29, as shown in FIG. 5.

Figure 8:
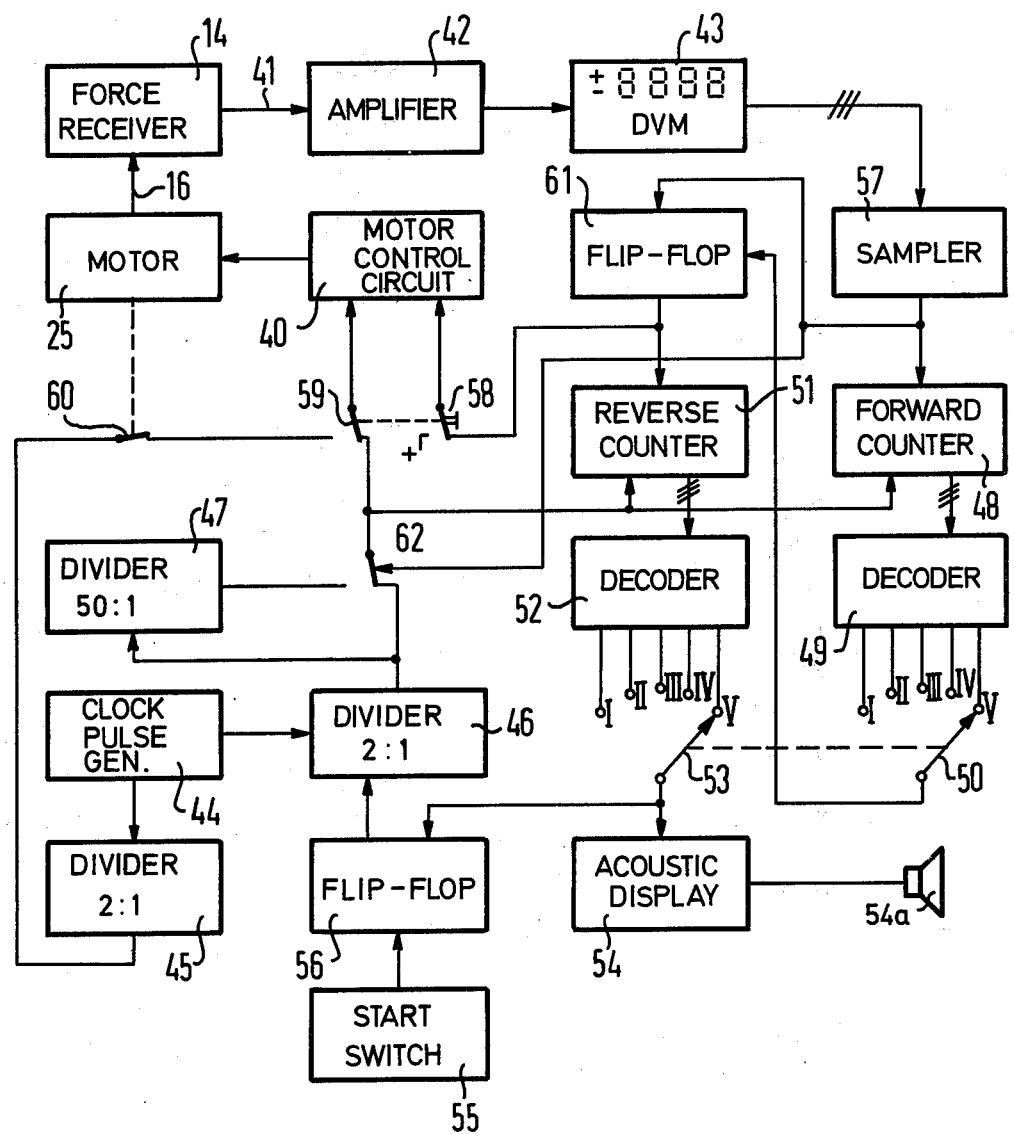
FIG. 8 is a circuit schematic for a control circuit for operating the apparatus of FIG. 5.

A block circuit diagram of a control circuit for the test apparatus of FIG. 5 is shown in FIG. 8. As stated above, the motor 25 is a step motor which receives its control signals from a control circuit 40. The control circuit 40 is programmed to correspond to an appropriate curve of the type shown in FIG. 4 for a clamp to be tested. As schematically represented in FIG. 8, the motor 25 moves the spindle 16 which, through the force receiver 14 acts on the enlarged portion 31 of the pressure actuator 12. Pressure is measured by the force receiver 14 and transmitted on a line 41 to an amplifier 42 which in turn is connected to a digital volt meter 43 for display. The digital volt meter 43 may be conveniently calibrated to directly display a force in newtons.

Operation of the circuit of FIG. 8 is as follows. A start switch 55 is actuated which sets a flip-flop 56 which releases the motor control circuit 40. The motor 25 receives its control pulses from a clock pulse generator 44 through two 2:1 dividers 45 and 46, which are for rapid advance and return of the spindle 16, and also receives control pulses from a 50:1 divider 47 for advancing the spindle 16 at a crawl speed. In order to adjust the spindle path ΔS1 according to FIG. 4 a forward counter 48 is provided which is connected to a decoder 49 and a select switch 50 for selection of different values corresponding to different clamp sizes. Similarly, a reverse counter 51 for adjusting the spindle path ΔS2 is provided which is connected to a decoder 55 and a select switch 53. An acoustic display 54 is provided having a speaker 54a to indicate when the read off time for a particular evaluation has been reached.

The digital volt meter 43 is connected to a zero-sampling unit 57 which enables the forward counter 48 when the zero point of the characteristic curve shown in FIG. 4 has been reached. Thus, as soon as a pressure develops, the forward counter 48 is enabled. An additional return key is referenced at 58 with which a switching contact 59 can be switched over in order that the step motor 25 may be driven in reverse operation in rapid return by the control circuit 40. When operating in reverse, the motor 25 receives its control pulses from an end sensor key 60, supported on a shaft 63 as shown in FIG. 5, and from the divider 45. Once the initial position has been reached, the end sensor key 60 is actuated so that the motor receives no more control pulses. The end sensor key 60 is mounted so as to be adjustable in height on the shaft 63.

A second flip-flop 61 and a switch-over installation 62 are activated also by the zero-sampling unit 57. The switch-over installation 62 is represented as a switching contact for simplification. As soon as the zero-sampling unit 57 determines that the zero-point of the characteristic curve according to FIG. 4 has been reached, the forward counter 48 is enabled and the crawl speed is begun by operation of the divider 47.

The position of the switch contacts 58 through 62 is illustrated in FIG. 8 as if a test operation has just been completed. After reading the expansion force which is to be monitored on the digital volt meter 43, a return key 58, comovable with a contact 59, is activated. The contact 58 supplies a rotational direction signal to the control circuit 40 and the contact 59 allows transmission of pulses from the clock pulse generator 44 for the purpose of returning the drive motor 25 to its initial position when the end sensor key 60 is closed. This switches control of the motor from the 50:1 divider 47 to the 2:1 divider 45 so that the motor can return the spindle 16 to its initial position relatively quickly. When the spindle 16 is returned to its initial position the end sensor key 60 is actuated and the motor 25 is stopped.

After removal of the test holder 30 from the test holder support frame 29, the tested clamp 1 is removed and replaced by a new clamp which is to be tested. Subsequent to insertion of the test holder 30 into the test holder support frame 29, the start switch 55 is actuated and another testing procedure is undertaken.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for testing the clamp strength of a solderless electric connector, said connector having a conductor receiving aperture and a pair of opposed expandable legs for receiving a pin in electrically conducting relation to exposed conductor wires comprising the steps of:

expanding said opposed legs a distance equal to expansion of said legs which results from receiving said pin therebetween;
contracting said opposed legs by an amount equal to the difference of the conductor diameter and an individual wire diameter; and
monitoring the clamping force generated by said opposed legs in the contracted state with respect to a minimum pre-determined clamping force.

2. The method of claim 1 wherein said connector has a base to which said opposed legs are perpendicularly attached, and wherein said step of expanding said opposed legs is further defined by the steps of:

supporting said connector by said opposed legs, and
applying a force perpendicularly to the center of said base of said connector.

3. The method of claim 2 further defined by the steps of:

supporting said opposed legs on the ends of a crossbar of a T-shaped member, and
applying said force to said center of said base by moving a pressure actuator through a bore in said T-shaped member to push said pressure actuator against said connector base.

4. The method of claim 3 wherein the steps of expanding and contracting said opposed legs are further defined by the steps of:

moving said pressure actuator in said bore a distance in a first direction and monitoring said clamping force until a first predetermined value of said force is reached, and
moving said pressure actuator in a second opposite direction and monitoring said clamping force until a second predetermined value of said clamping force is reached.

5. An apparatus for testing the clamp strength of a solderless electric connector, said connector having a conductor receiving aperture and a pair of opposed expandable legs for receiving a pin in electrically conducting relation to expose conductor wires, said apparatus comprising:

a double-T-shaped member having first and second parallel crossbars joined by a vertical portion of said member, said first crossbar having a greater length than said second crossbar and said second crossbar having a width receivable between said opposed legs of said connector;
a support means for said double-T-shaped member, said support means having spaced bearing surfaces for supporting the ends of said first crossbar with said second crossbar disposed beneath and between said bearing surfaces;
said double-T-shaped member having a bore through said vertical portion thereof and a pressure actuator slidably received in said bore;
a means for monitoring pressure applied by said pressure actuator, whereby movement of said actuator in said bore applies a selected pressure to a connector to be tested supported on said second crossbar.

6. The apparatus of claim 5 further comprising:

a step motor;
a spindle driven by said step motor for stepped advancement and return of said spindle;
and a coupling between said spindle and said pressure actuator to transmit movement of said spindle to said pressure actuator and to measure pressure applied by said pressure actuator to said connector to be tested.

7. The apparatus of claim 6 wherein said coupling is a washer comprised of piezoelectric material disposed between said spindle and said pressure actuator, and connected to said monitoring means.

8. The apparatus of claim 6 wherein the speed of said motor is controlled by the frequency of a pulse train supplied to said motor by a motor control circuit, and wherein said motor control circuit generates a high frequency pulse train for fast operation of said motor and a low frequency pulse train for slow operation of said motor.

9. The apparatus of claim 8 wherein said motor control circuit provides said high frequency pulse train for a first portion of the advancement of said spindle and provides said low frequency pulse train for a second portion of the advancement of said spindle, and provides said high frequency pulse train for return of said spindle.

10. The apparatus of claim 8 further comprising a sensor for providing a signal when advancement of said spindle produces a pre-selected pressure on said clamp to be tested and wherein said motor control circuit reverses the direction of operation of said motor upon receipt of said signal, and wherein said sensor provides a second signal to said motor control circuit to cease motor operation after a specified signal return distance.

11. The apparatus of claim 5 further comprising a means for generating an acoustic signal if the clamp strength of a connector to be tested is below a predetermined minimum level when said spindle is returned a predetermined specified distance.

* * * * *